(12) United States Patent
Ebert

(10) Patent No.: US 9,083,138 B2
(45) Date of Patent: Jul. 14, 2015

(54) MICRO-SCALE COOLING ELEMENT

(75) Inventor: Thomas Ebert, Aachen (DE)

(73) Assignee: IQ EVOLUTION GMBH, Dusseldorf (DE)

( * ) Notice: Subject to any disclaimer, the term of this patent is extended or adjusted under 35 U.S.C. 154(b) by 905 days.

(21) Appl. No.: 11/302,536

(22) Filed: Dec. 14, 2005

(65) Prior Publication Data

US 2006/0157221 A1    Jul. 20, 2006

(30) Foreign Application Priority Data

Dec. 20, 2004  (EP) ..................................... 04030201

(51) Int. Cl.
*H01L 23/24* (2006.01)
*H01S 5/024* (2006.01)
*H01L 23/473* (2006.01)
*H01S 5/40* (2006.01)

(52) U.S. Cl.
CPC .............. *H01S 5/024* (2013.01); *H01L 23/473* (2013.01); *H01S 5/4025* (2013.01); *H01L 2924/0002* (2013.01); *H01S 5/02423* (2013.01)

(58) Field of Classification Search
USPC .......................................... 257/714, E23.098
See application file for complete search history.

(56) References Cited

U.S. PATENT DOCUMENTS

| 4,667,219 | A | * | 5/1987 | Lee et al. ....................... 257/693 |
| 5,086,333 | A | | 2/1992 | Osada |
| 5,263,251 | A | | 11/1993 | Matthews |
| 5,548,605 | A | | 8/1996 | Benett |
| 6,578,626 | B1 | | 6/2003 | Calaman |

FOREIGN PATENT DOCUMENTS

| DE | 43 15 580 A1 | 11/1994 |
| DE | 195 06 091 A1 | 8/1996 |
| EP | 1 211 730 A2 | 6/2002 |

* cited by examiner

*Primary Examiner* — Ori Nadav
(74) *Attorney, Agent, or Firm* — Berenato & White, LLC

(57) ABSTRACT

The invention relates to a micro-scale cooling element (1) having a mounting surface (2) for a constituent part, in particular a semiconductor component, that is to be cooled, which element is configured, in particular, cuboidally and has in the interior a micro-scale cooling structure (3) that is connected via connecting conduits (4) to at least one inflow opening (5) and at least one outflow opening (6) through which a cooling medium is conveyable to and dischargeable from the micro-scale structure (3), the micro-scale cooling element having a monolithic structure.

22 Claims, 2 Drawing Sheets

MICRO-SCALE COOLING ELEMENT

FIELD OF THE INVENTION

The present invention relates to a micro-scale cooling element having a mounting surface for a constituent part, in particular a semiconductor component, that is to be cooled, which element is configured, in particular, cuboidally and has in the interior a micro-scale cooling structure that is connected via connecting conduits to at least one inflow opening and at least one outflow opening through which a cooling medium is conveyable to and dischargeable from the micro-scale structure. The invention further relates to a diode laser component having a soldered-on diode laser or a diode laser stack that comprise such micro-scale cooling elements, as well as a method for manufacturing a micro-scale cooling element.

BACKGROUND OF THE INVENTION

Micro-scale cooling elements of the aforesaid kind are known, and are described e.g. in DE 4 315 580 A1. The micro-scale cooling elements comprise a plurality of individual plies or layers of structured copper films approximately 300 μm thick.

In order to manufacture the micro-scale cooling element, the copper films are layered onto one another in suitable fashion so that the structures that are, for example, etched or stamped into the copper films form a cooling circuit having a micro-scale cooling structure, connecting conduits, and an inflow and outflow.

The copper films are then connected to one another by direct copper bonding, for which purpose oxide layers are created on the surfaces of the copper layers and are then welded to one another.

During operation, a cooling medium such as, for example, deionized water flows through the micro-scale cooling element that has been built up in layers. The use of deionized water as a cooling medium is regarded as advantageous because it exhibits only a small degree of interaction with the material of the micro-scale cooling element.

A problem that is perceived with direct copper bonding is that the connections formed between the oxide layers have little sealing tightness, so that the micro-scale cooling element must have a minimum wall thickness of 400 μm in order to ensure a minimum level of protection from micro-scale cooling element leakage.

Because of the oxide layers and because the structures forming the cooling circuit are for the most part etched into the copper films, the micro-scale cooling element is furthermore susceptible to corrosion.

To avoid this corrosion, it is proposed in the existing art to apply passivating layers, made e.g. of nickel, onto the copper layers. The passivating layer is ablated, however, as a result of the flow of deionized water in the micro-scale cooling element, especially in sharp edge regions, and is carried off by the deionized water. The ions thereby introduced into the deionized water can act as a kind of "breakdown catalyst." The result is that the corrosion susceptibility of the copper exposed in the ablated regions is in some cases in fact accelerated.

A further problem regarding the use of micro-scale cooling elements made of copper is that copper possesses a coefficient of thermal expansion of approximately 17, whereas a component to be soldered onto the micro-scale cooling element, such as e.g. a high-power diode laser made of gallium arsenide, has a coefficient of thermal expansion of approximately 6.5. Stress and distortion between the micro-scale cooling element and the particular soldered-on component can occur as a result of the differing coefficients of thermal expansion.

To solve this problem, the document DE 195 06 091 A1 proposes to provide ceramic layers between the individual copper layers, and to connect the respective ceramic layers to one another in planar fashion using the direct copper bonding technique. The ceramic layers are provided for that purpose with a copper layer on their external sides, a component to be cooled (in this case a diode laser) being arranged on the topmost layer. To improve thermal conductivity, an insert or a buried layer of a material having extremely high thermal conductivity, for example diamond or T-cBN, is introduced into the ceramic layer below the diode layer arrangement. The use of the ceramic layers is intended to ensure that the substrate exhibits a greatly reduced coefficient of thermal expansion as compared with a substrate or cooling element that is made exclusively or metal and in particular of copper.

As already explained above, both a sealing problem and a corrosion problem affect the arrangement known from the document DE 195 06 091 A1 because of the use of oxide layers. Internal stresses can also arise between the copper and ceramic layers, and can likewise result in leakage.

SUMMARY OF THE INVENTION

It is therefore the object of the present invention to furnish a micro-scale cooling element, as well as a method for manufacturing it, that make possible a decrease in the minimum external wall thicknesses of the micro-scale cooling element, in order to achieve improved heat dissipation in the region of the mounting surfaces for electronic components, without having to accept a decrease in the leakage tightness of the micro-scale cooling element.

This object is achieved, according to the present invention, in that the micro-scale cooling element has a monolithic structure.

In other words, the invention is based on the fundamental idea that the sealing problem is diminished by the avoidance of joints such as those present in micro-scale cooling elements built up in layers. This is achieved by the fact that a monolithic micro-scale cooling element is manufactured. The monolithic structure of the micro-scale cooling element allows the required minimum external wall thickness of the micro-scale cooling element to be greatly decreased as compared with the wall thicknesses of known copper heat sinks, so that a substantially larger contact area is achieved between the region through which a cooling medium, for example deionized water, can flow for heat exchange, and the region in which the electronic components are soldered on.

Advantageously, the micro-scale cooling element according to the present invention can be manufactured by selective laser melting. The selective laser melting process makes it possible to generate any desired monolithic, three-dimensional shapes and structures inside the micro-scale cooling element.

External wall thicknesses of less than 400 μm, in particular external wall thicknesses of approximately 100 μm, can be achieved in the micro-scale cooling element according to the present invention, so that the temperature gradient within the soldered-on electronic components themselves can also be reduced.

An exemplifying embodiment of the present invention provides for configuring the micro-scale cooling element from high grade steel. The corrosion resistance of high grade steel reduces the risk of corrosion and consequently of micro-scale cooling element leakage brought about by corrosion, so that the minimum external wall thickness can be kept correspondingly low. The resulting improvement in heat exchange in the contact region between the micro-scale cooling element and the electrical component compensates for the inherently poorer thermal conductivity of the high grade steel.

In order to decrease internal stresses that may arise between the electronic components and the micro-scale cooling element because of their differing coefficients of thermal expansion, an alternative exemplifying embodiment of the invention proposes to configure the micro-scale cooling element from a material adapted to the coefficient of thermal expansion of the component that is to be cooled. In the case of a component to be cooled made of gallium arsenide, having a coefficient of thermal expansion of approximately 6.5, it is possible, for example, to select molybdenum, having a coefficient of thermal expansion of approximately 5, as a material for the micro-scale cooling element.

In order further to enhance the cooling effect in the contact region between the electronic component and the micro-scale cooling element, the micro-scale cooling structure can be embodied in such a way that a turbulent flow is established therein, thereby achieving improved cooling performance.

The micro-scale cooling structure can comprise comb-shaped extensions arranged with a small spacing from one another. Because of the small spacings of the comb-shaped extensions with respect to one another, the boundary surfaces that are thus located close to one another can also influence each other, once again resulting in an improved cooling effect.

According to a further exemplifying embodiment of the invention, the connecting conduits have a flow-optimized structure, in particular in the form of rounded, especially oval, inner walls and boundary surfaces, so that an almost laminar flow is established in the connecting conduits. A laminar flow in the region of the connecting conduits is desirable in order to minimize the pressure drop in the cooling medium as it flows through the micro-scale cooling element.

The micro-scale cooling elements according to the present invention can also be inserted into so-called diode laser stacks in order to cool the diode lasers present therein. It is advantageous for this application to embody the micro-scale cooling elements in cuboidal form, since the micro-scale cooling elements according to the present invention are stacked one above another in the stacks. Each cuboidal micro-scale cooler forms a flat support surface for the micro-scale cooler to be stacked on top of it, so that a stable connection between the individual micro-scale coolers can be produced. For operation of the stack, the inflow and outflow openings of the individual micro-scale cooling elements are attached to a common inflow conduit configured in the stack, and to a common outflow conduit for the cooling medium.

BRIEF DESCRIPTION OF THE DRAWINGS

With regard to further advantageous embodiments and refinements of the invention, the reader is referred to the dependent claims and to the description below of an exemplifying embodiment with reference to the appended drawings, in which:

DETAILED DESCRIPTION OF THE PREFERRED EMBODIMENT(S)

Figure 1:
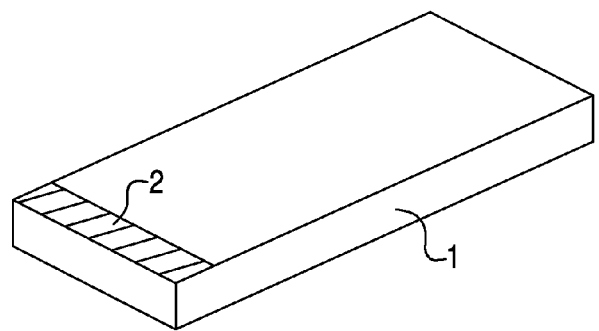
FIG. 1 is a perspective depiction of a micro-scale cooling element according to the present invention.
Figure 2:
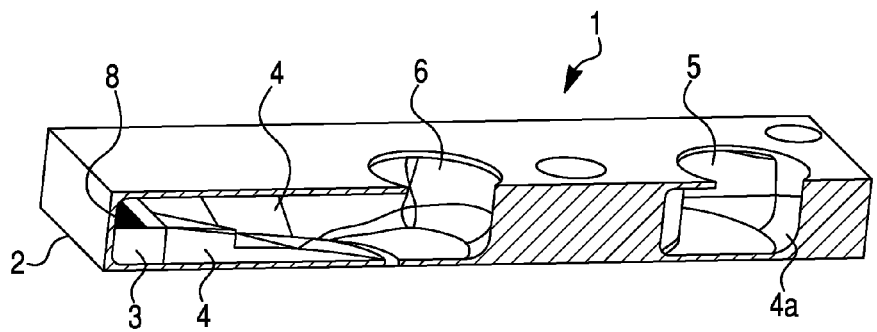
FIG. 2 is a longitudinal section through a micro-scale cooling element according to FIG. 1, rotated 180 degrees; the inflow and outflow openings of the individual micro-scale cooling elements are attached to a common inflow conduit configured in the stack, and to a common outflow conduit for the cooling medium.

FIGS. 1 and 2 show an exemplifying embodiment of a micro-scale cooling element 1 according to the present invention.

Micro-scale cooling element 1 is of substantially cuboidal configuration and has, on the upper side in the front end region, a mounting surface 2 for a component to be cooled, such as e.g. a semiconductor component. Arranged below mounting surface 2 in the interior of micro-scale cooling element 1 is a micro-scale cooling structure 3 that, together with connecting conduits 4, at least one inflow opening 5, and at least one outflow opening 6, forms a cooling circuit 7 through which a cooling medium such as, for example, deionized water can flow for cooling purposes.

Micro-scale cooling structure 3 is constituted, in a manner known per se, by comb-shaped extensions 8 that are arranged with a small spacing from one another, so that the boundary surfaces of comb-shaped extensions 8 can influence one another.

Figure 3:
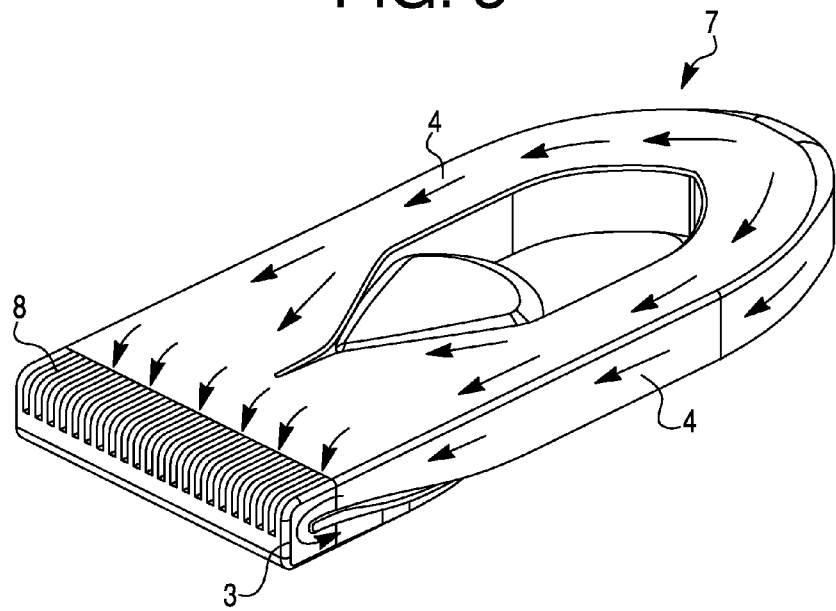
FIG. 3 is a perspective depiction from above of a cooling circuit configured in the micro-scale cooling element according to FIG. 1.
Figure 4:
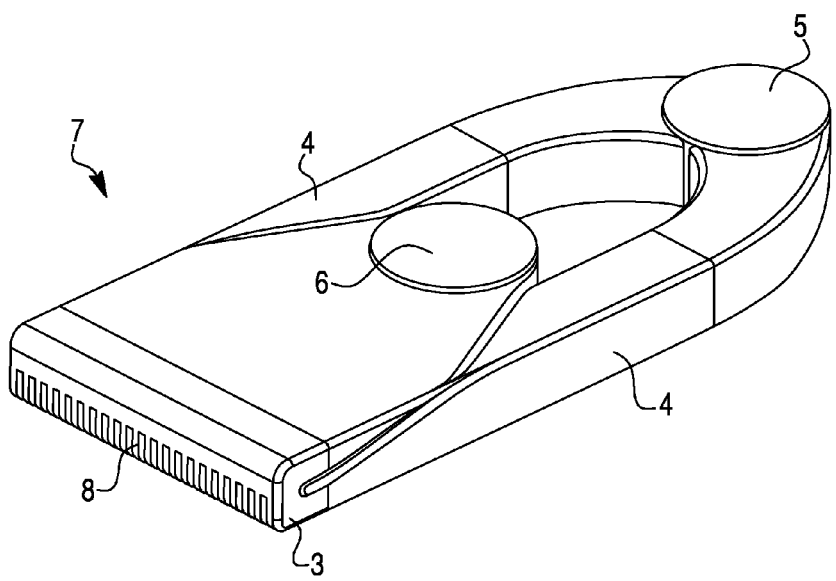
FIG. 4 is a perspective depiction from below of the cooling circuit of FIG. 3.

As is apparent from FIGS. 3 and 4, connecting conduits 4 have a flow-optimized structure in the form of rounded, in particular oval, walls and boundary surfaces 4a, so that an almost laminar flow is established in connecting conduits 4. Any pressure drop in the cooling medium flowing through micro-scale cooling element 1 is thereby diminished. The cross section of connecting conduits 4 decreases toward micro-scale cooling structure 3, so that a turbulent flow is established in this region. This results in improved heat exchange. The establishment of a turbulent flow can be further assisted by suitable structuring of the surfaces of connecting conduits 4. An example of a flow pattern of the cooling medium in micro-scale cooler 1 is indicated in FIG. 3 using black arrows.

Micro-scale cooling element 1 shown in the Figures is intended to be used to cool a diode laser bar made of gallium arsenide, which has a coefficient of thermal expansion of approximately 6.5. Micro-scale cooling element 1 is therefore constructed from molybdenum, which has a coefficient of thermal expansion of approximately 5. Adaptation of the coefficients of thermal expansion of the diode laser bar and the material of micro-scale cooling element 1 allows internal stresses to be reduced. The selection of materials for adaptation to the coefficients of thermal expansion is not, however, limited to the aforementioned metallic materials. Further materials are also conceivable, depending on their mechanical properties and the coacting components.

Micro-scale cooling element 1 can be manufactured by selective laser melting. In this method, the component to be manufactured is first subdivided into virtual sections along the Z plane of the component, and the resulting CAD data for the X and Y directions are inputted into a control unit. A powdered metallic material, made of e.g. high grade steel or molybdenum having no binders or fluxes, is then applied, to a predetermined layer height that corresponds to a penetration depth of a laser beam used in the method, onto a baseplate, lowerable in the Z direction, of a process chamber. In an inert-gas atmosphere, a laser beam is displaced over the powder layer in accordance with the CAD data inputted into the control unit, so that the metallic powder is locally heated to melting temperature and, at the particular incidence point of the laser beam, is completely melted through its entire layer height. The baseplate is then lowered by an amount that corresponds to the layer thickness of the metal powder that was added. A further layer of the powdered metallic material, whose layer thickness once again corresponds to the penetration depth of the laser beam, is then applied onto the metal powder layer already present that has been processed with laser radiation. The laser beam is then once again displaced in the X and Y directions in accordance with the CAD data inputted into the control system for the micro-scale cooling element to be manufactured, and the material at the laser's incidence point is once again completely melted through its entire layer thickness. This procedure is repeated until the micro-scale cooling element has been completely structured and built up.

The laser beam is guided in multiple tracks over the predetermined region of the material layer, in such a way that each subsequent track of the laser beam partially overlaps the previous track. As a result of the overlap, the melted powder and the melted portion of the adjacent and already solidified solid contour that was previously melted and is located beneath the subsequently applied powder layer, are melted to form a combined melt bath. The melt bath thereupon enters into a melt-metallurgical bond. The result is to form, after solidification, a homogeneous shaped element with high strength and sealing tightness, and with no ribs or other transition points.

Once the micro-scale cooling element has been completely built up in this fashion, all that is then necessary is to remove the powder that remains behind in the internal structures. This can be achieved, for example, using compressed air, or by subsequently flushing the micro-scale cooling element with deionized water under pressure.

Because a very wide variety of metallic powdered materials can be processed using this method, any other suitable metal is also conceivable in addition to a micro-scale cooling element material such as molybdenum and high grade steel. The powdered material to be produced from the metal that is used merely needs to have a sufficiently fine particle size, so that the individual layers can be built up in closely spaced fashion.

The invention claimed is:

1. A micro-scale cooling element having
    a mounting surface for a semiconductor component, that is to be cooled,
    which element is configured cuboidally and has in the interior a micro-scale cooling structure that is connected via connecting conduits to at least one inflow opening and at least one outflow opening through which a cooling medium is conveyable to and dischargeable from the micro-scale structure,
    wherein said cooling element has a monolithic structure and the micro-scale cooling structure together with connecting conduits, the at least one inflow opening, and the at least one outflow opening, form a cooling circuit which is formed within the micro-scale cooling element.

2. The micro-scale cooling element according to claim 1, wherein said cooling element has external wall thicknesses of less than 400 μm.

3. The micro-scale cooling element according to claim 1 or 2, wherein said cooling element is made from high grade steel.

4. The micro-scale cooling element according to claim 1 or 2, wherein said cooling element is made from molybdenum.

5. The micro-scale cooling element according to claim 1, wherein the connecting conduits have a structure promoting almost laminar flow therein.

6. The micro-scale cooling element according to claim 1, wherein the connecting conduits have rounded walls and boundary surfaces.

7. The micro-scale cooling element according to claim 1, wherein the connecting conduits have oval walls and boundary surfaces.

8. The micro-scale cooling element according to claim 5, wherein the connecting conduits have rounded walls and boundary surfaces.

9. The micro-scale cooling element according to claim 5, wherein the connecting conduits have oval walls and boundary surfaces.

10. The micro-scale cooling element according to claim 1, wherein turbulent flow is established in the region of the cooling structure.

11. The micro-scale cooling element according to claim 5, wherein turbulent flow is established in the region of the cooling structure.

12. The micro-scale cooling element according to claim 1, wherein the cross section of the connecting conduits decreases toward the cooling structure.

13. The micro-scale cooling element according to claim 10, wherein the cross section of the connecting conduits decreases toward the cooling structure.

14. The micro-scale cooling element according to claim 1, wherein the cooling structure comprises comb-shaped extensions.

15. The micro-scale cooling element according to claim 1, further having a diode laser soldered-on to the micro-scale cooling element.

16. A diode laser stack having at least two diode laser components, arranged one another, that each comprise a micro-scale cooling element according to claim 1.

17. A diode laser stack according to claim 16, wherein the inflow and outflow openings of the micro-scale cooling elements are in communication with each other via a common inflow conduit and a common outflow conduit.

18. The micro-scale cooling element according to claim 1, wherein the cooling element is manufactured by selective laser melting.

19. The micro-scale cooling element according to claim 1, wherein the at least one inflow opening is located at the center of a first end of the micro-scale cooling element.

20. The micro-scale cooling element according to claim 1, wherein the at least one outflow opening is located at the center of the micro-scale cooling element.

21. The micro-scale cooling element according to claim 1, wherein each of the at least one inflow openings are attached to an inflow connecting conduit and each of the at least one outflow openings are connected to an outflow connecting conduit.

22. A device comprising:
    a micro-scale cooling element having a monolithic structure and including:
        an inflow opening located at the center of a first end of said micro-scale cooling element;
        at least two inflow conduits connected to said inflow opening and traversing the length of said micro-scale cooling element;
        a micro-scale cooling structure comprising a plurality of comb-shaped extensions and located opposite said inflow opening at a second end of said micro-scale cooling element, said at least two inflow conduits connected to a bottom of said micro-scale cooling structure;
an outflow conduit connected to a top of said micro-scale cooling structure; and
an outflow opening located at the center of the top of said micro-scale cooling element and connected to said outflow conduit,
wherein said inflow opening, said at least two inflow conduits, said micro-scale cooling structure, said outflow conduit, and said outflow opening form a cooling circuit within said micro-scale cooling element.

* * * * *